United States Patent
Ramirez et al.

(10) Patent No.: US 11,736,095 B2
(45) Date of Patent: Aug. 22, 2023

(54) LOW POWERED CLOCK DRIVING

(71) Applicant: INTERNATIONAL BUSINESS MACHINES CORPORATION, Armonk, NY (US)

(72) Inventors: Daniel Ramirez, Rochester, MN (US); Sudipto Chakraborty, Plano, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 17/987,189

(22) Filed: Nov. 15, 2022

(65) Prior Publication Data

US 2023/0078255 A1 Mar. 16, 2023

Related U.S. Application Data

(62) Division of application No. 17/347,760, filed on Jun. 15, 2021.

(51) Int. Cl.
| | |
|---|---|
| *H03K 3/00* | (2006.01) |
| *H03K 3/353* | (2006.01) |
| *H03K 5/13* | (2014.01) |
| *H03K 5/00* | (2006.01) |

(52) U.S. Cl.
CPC ............... *H03K 3/353* (2013.01); *H03K 5/13* (2013.01); *H03K 2005/00195* (2013.01)

(58) Field of Classification Search
CPC ..................... H03K 3/353; H03K 5/13; H03K 2005/00195; Y02D 10/00
USPC .......................................................... 327/108
See application file for complete search history.

(56) References Cited

U.S. PATENT DOCUMENTS

| | | | |
|---|---|---|---|
| 5,337,339 A | 8/1994 | Hillstrom | |
| 6,509,725 B1 | 1/2003 | Bernstein et al. | |
| 6,510,100 B2 | 1/2003 | Grundon et al. | |
| 6,646,472 B1 | 11/2003 | Trivedi et al. | |
| 6,734,703 B1 * | 5/2004 | Alfke | G01R 31/31725 326/38 |
| 6,975,154 B1 * | 12/2005 | Pedersen | G06F 1/10 327/295 |
| 7,821,296 B2 | 10/2010 | Singer et al. | |
| 7,888,991 B2 * | 2/2011 | Lin | H03K 3/35613 327/539 |
| 8,278,993 B2 * | 10/2012 | Lin | G06F 1/10 327/541 |
| 8,330,512 B2 | 12/2012 | Kim et al. | |
| 8,536,922 B2 * | 9/2013 | Lin | G06F 1/10 327/299 |
| 9,018,996 B1 * | 4/2015 | Zarei | H03K 5/15033 327/254 |

(Continued)

OTHER PUBLICATIONS

International Search Report and Written Opinion, PCT/CN2022/098339, dated Aug. 31, 2022, 9 pages.

(Continued)

*Primary Examiner* — Ryan Jager
(74) *Attorney, Agent, or Firm* — Nathan M. Rau

(57) ABSTRACT

A clock driver circuit for low powered clock driving may include: a multiple phase divider; a buffer supplying at least one of multiple phases to the multiple phase divider at a center frequency that is an integer multiple of an input frequency; and wherein the multiple phase divider and the buffer share a same current from a supply rail.

20 Claims, 8 Drawing Sheets

(56) References Cited

U.S. PATENT DOCUMENTS

| | | | |
|---|---|---|---|
| 9,411,361 B2* | 8/2016 | Balasubramanian | G06F 1/12 |
| 9,417,655 B2* | 8/2016 | Balasubramanian | G06F 1/10 |
| 10,712,769 B2* | 7/2020 | Zhang | H03K 5/1506 |
| 10,762,947 B2 | 9/2020 | Lee et al. | |
| 10,873,484 B2* | 12/2020 | Chen | H03F 3/245 |
| 10,951,216 B1 | 3/2021 | Barnette et al. | |
| 11,132,015 B2* | 9/2021 | Asaki | G06F 1/08 |
| 11,327,523 B2* | 5/2022 | Fayneh | G06F 1/08 |
| 11,349,457 B2* | 5/2022 | Kim | H03L 7/0812 |
| 11,424,735 B2* | 8/2022 | Han | H03K 3/017 |
| 11,588,474 B2* | 2/2023 | Ramirez | H03K 3/353 |
| 2011/0014880 A1* | 1/2011 | Nicolson | G01S 7/034 |
| | | | 716/132 |
| 2013/0049827 A1* | 2/2013 | Bucelot | G06F 1/10 |
| | | | 327/144 |
| 2014/0254295 A1* | 9/2014 | Shim | G11C 11/4093 |
| | | | 365/194 |
| 2017/0219643 A1* | 8/2017 | Kim | G01R 29/26 |
| 2018/0247683 A1 | 8/2018 | Lee et al. | |
| 2019/0102109 A1 | 4/2019 | Kim et al. | |
| 2022/0077862 A1* | 3/2022 | Hong | G06F 3/0659 |
| 2022/0231694 A1* | 7/2022 | Kurihara | H03L 7/18 |
| 2022/0399882 A1* | 12/2022 | Ramirez | H03K 5/13 |
| 2023/0078255 A1* | 3/2023 | Ramirez | H03K 3/353 |
| 2023/0082056 A1* | 3/2023 | Han | G06F 1/08 |

OTHER PUBLICATIONS

P202009564US02, Appendix P; List of IBM Patent or Applications Treated as Related, Nov. 15, 2022, 2 pages.

* cited by examiner

LOW POWERED CLOCK DRIVING

BACKGROUND

Field of the Invention

The field of the invention is data processing, or, more specifically, methods, apparatus, and products for low powered clock driving.

Description of Related Art

The development of the EDVAC computer system of 1948 is often cited as the beginning of the computer era. Since that time, computer systems have evolved into extremely complicated devices. Today's computers are much more sophisticated than early systems such as the EDVAC. Computer systems typically include a combination of hardware and software components, application programs, operating systems, processors, buses, memory, input/output devices, and so on. As advances in semiconductor processing and computer architecture push the performance of the computer higher and higher, more sophisticated computer software has evolved to take advantage of the higher performance of the hardware, resulting in computer systems today that are much more powerful than just a few years ago.

Low power arrays are used in a variety of devices, including memory arrays, sensor arrays, quantum computing, antenna arrays, and the like. Most low power arrays require a clock to be sent to each of the array elements concurrently so that there is a least amount of uncorrelated jitter among the array elements. As arrays can include a large number of elements (e.g., over one thousand), a low power clocking solution is critical to dedicate most of the power consumption towards signal processing.

Larger arrays require longer clock distribution routes, requiring several milliwatts (mW) of power consumption as they are typically driven with broadband drivers. Broadband drivers consume large amounts of power as they need to provide square waveshape pulses and require duty cycle correction in most cases. Such additional blocks lead to inferior trade-offs for dynamic range per mW metric. Existing solutions use an H-tree layout for clocking in arrays with a clock receiver associated with individual channels to the correct levels. These clock receivers add to large uncorrelated out of band jitter.

SUMMARY

In some embodiments, a clock driver circuit for low powered clock driving may include: a multiple phase divider; and a buffer supplying at least one of multiple phases to the multiple phase divider at a center frequency that is an integer multiple of an input frequency; and wherein the multiple phase divider and the buffer share a same current from a supply rail.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

Figure 1:
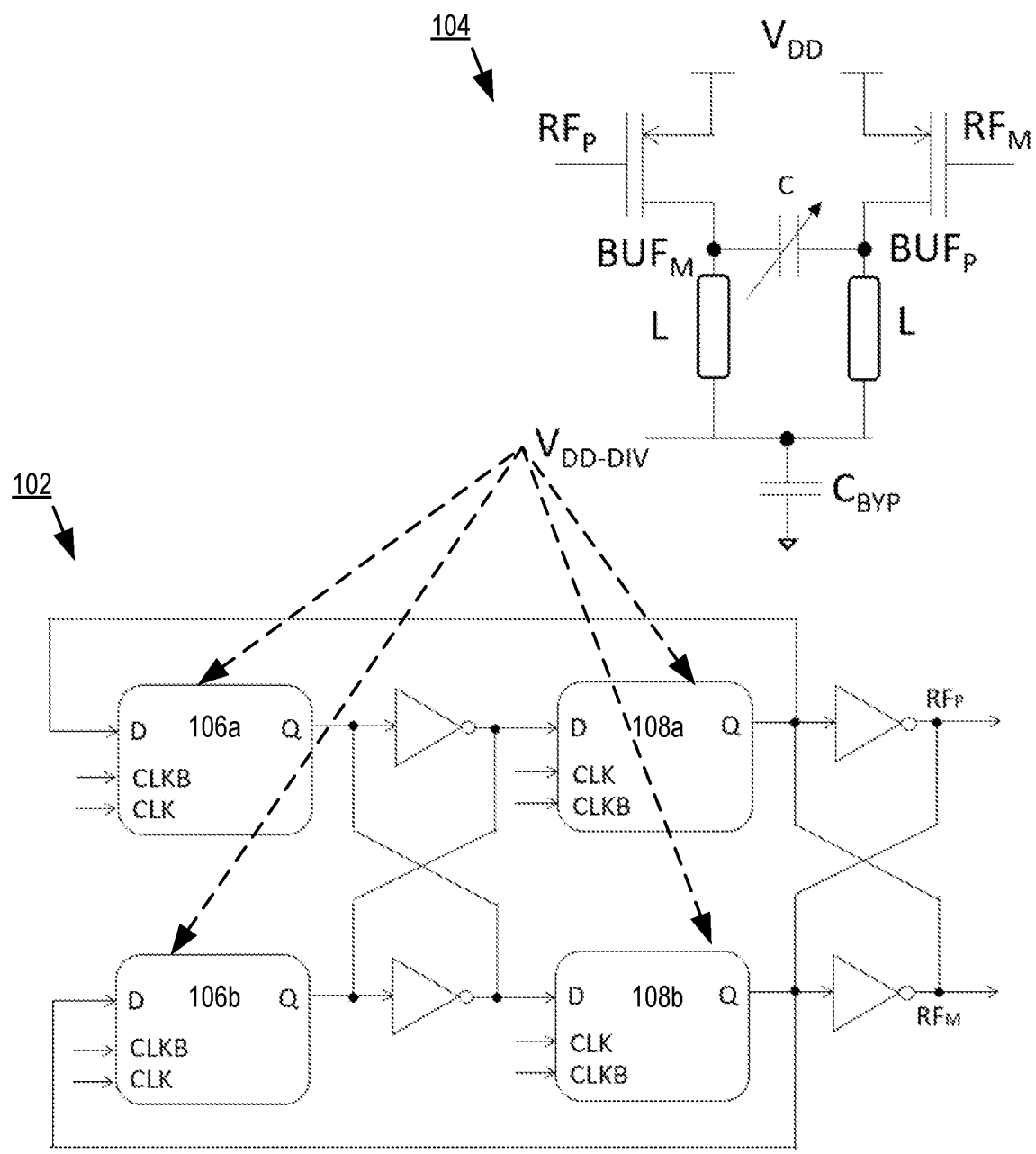
FIG. 1 is a circuit diagram of an example clock driver circuit for low powered clock driving according to some embodiments of the present disclosure.

FIG. 1 sets forth a circuit diagram of an example clock driver circuit for low powered clock driving according to some embodiments of the present disclosure. The example clock driver circuit of FIG. 1 includes a multiple phase divider 102 and a buffer 104. The multiple phase divider 102 is configured to receive, as input, a clock signal at a first frequency and outputs another clock signal at a second frequency that is equal to the first frequency divided by some integer value. The multiple phase divider 102 can operate with both square and a sinusoidal waveforms at the input and provide a square waveshape at the output. For example, assuming a clock signal input at frequency N, the multiple phase divider 102 outputs a clock signal at frequency N/2, N/4, or N divided by some other integer value. One skilled in the art will appreciate that the integer value by which the multiple phase divider 102 divides the input signal is dependent on the number of delay cells in the feedback loop. Accordingly, though the multiple phase divider 102 of FIG. 1 is shown as a divide-by-2 divider, one skilled in the art will appreciate that other configurations are also contemplated within the scope of the present disclosure.

Figure 2:
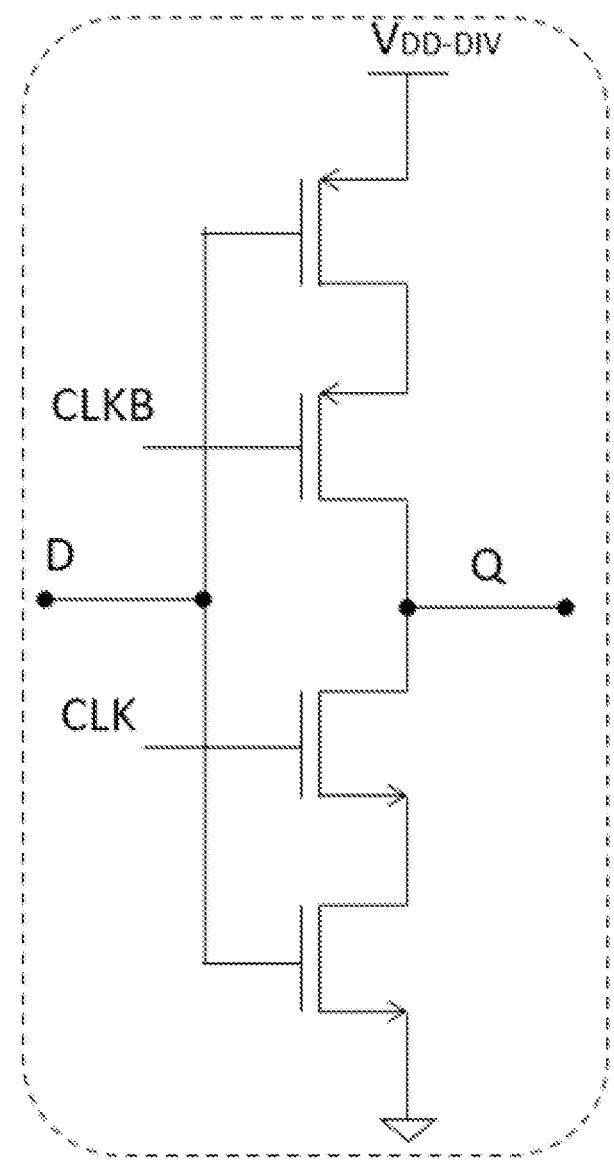
FIG. 2 is a circuit diagram of a delay cell used in an example dynamic D-type flip flop according to some embodiments of the present disclosure.

In this example, the clock signal is embodied as two complementary clock signals CLK and CLKB each with non-overlapping pulses. In other words, the multiple phase divider 102 accepts, as input, a two-phase clock signal. In some embodiments, the clock signals CLK and CLKB are received from a clock signal generator such as an oscillator (not shown). The multiple phase divider 102 outputs complementary clock signals Radio Frequency plus ($RF_P$) and Radio Frequency minus ($RF_M$), where $RF_M$ is shifted one-hundred and eighty degrees from $RF_P$. The complementary clock signals CLK and CLKB are provided to Dynamic D-type Flip Flops (DDFF) 106a, 106b, 108a, and 108b. Each of the DDFFs 106a,b and 108a,b may be implemented as a clocked delay cell 200 as shown in FIG. 2. Each of the DDFFs 106a,b and 108a,b are provided a divider voltage $V_{DD\text{-}DIV}$. In some embodiments, the voltage terminals for each DDFFs 106a,b and 108a,b receiving the $V_{DD\text{-}DIV}$ are shorted together.

The outputs $RF_P$ and $RF_M$ from the multiple phase divider 102 are provided as inputs to the buffer 104. The buffer 104 provides an impedance transformation (using inductance L and its associated capacitances) to provide the desired amplitude of signal at the load and prevent the inputs to the buffer 104 (the outputs $RF_P$ and $RF_M$ from the multiple phase divider) from being affected by the kickback noise from the outputs. The buffer 104 also receives an input voltage $V_{DD}$, which is the main supply voltage of the clock driver circuit. The plus and minus outputs of the buffer 104 are shown as $BUF_P$ and $BUF_M$, respectively, with $BUF_M$ being shifted one-hundred and eighty degrees in-phase from that of $BUF_P$. A variable capacitor C is coupled to $BUF_P$ and $BUF_M$ and a bypass capacitor CBYP is coupled to each inductance L. As shown, the buffer 104 provides the $V_{DD\text{-}DIV}$ to the multiple phase divider 102.

In some embodiments, the multiple phase divider 102 and the buffer 104 are stacked (e.g., the buffer 104 is stacked on the multiple phase divider 102). In some embodiments, a clock signal generator such as an oscillator may be stacked with the multiple phase divider 102, the buffer 104, or both. In some embodiments, the multiple phase divider 102 and the buffer 104 share a common current. That is, both the multiple phase divider 102 and the buffer 104 share a current from a same supply rail (e.g., are connected in parallel). This reduces the overall power consumption of the clock driver circuit.

In some embodiments, the buffer 104 is inductively loaded to the desired harmonic of the multiple phase divider 102. For example, in some embodiments, the buffer 104 is inductively loaded to a fundamental harmonic of the outputs of the multiple phase divider 102 (e.g., for a frequency f applied to the frequency divider, the buffer 104 is inductively loaded to f/2). In other embodiments, the buffer is inductively loaded to an odd harmonic of the multiple phase divider 102 (e.g., for a frequency f, the buffer 104 is inductively loaded to 3f/2). Accordingly, in some embodiments, an output frequency of the clock driver circuit is calculated as $F_{out}=(M/N)*F_{in}$, where $F_{in}$ is the input frequency, N is an integer frequency division provided by the multiple phase divider 102 and M is a frequency multiplier obtained by resonating at an output of the buffer 104 amplifying the Mth harmonic of a signal at an output of the multiple phase divider 102.

Figure 3:
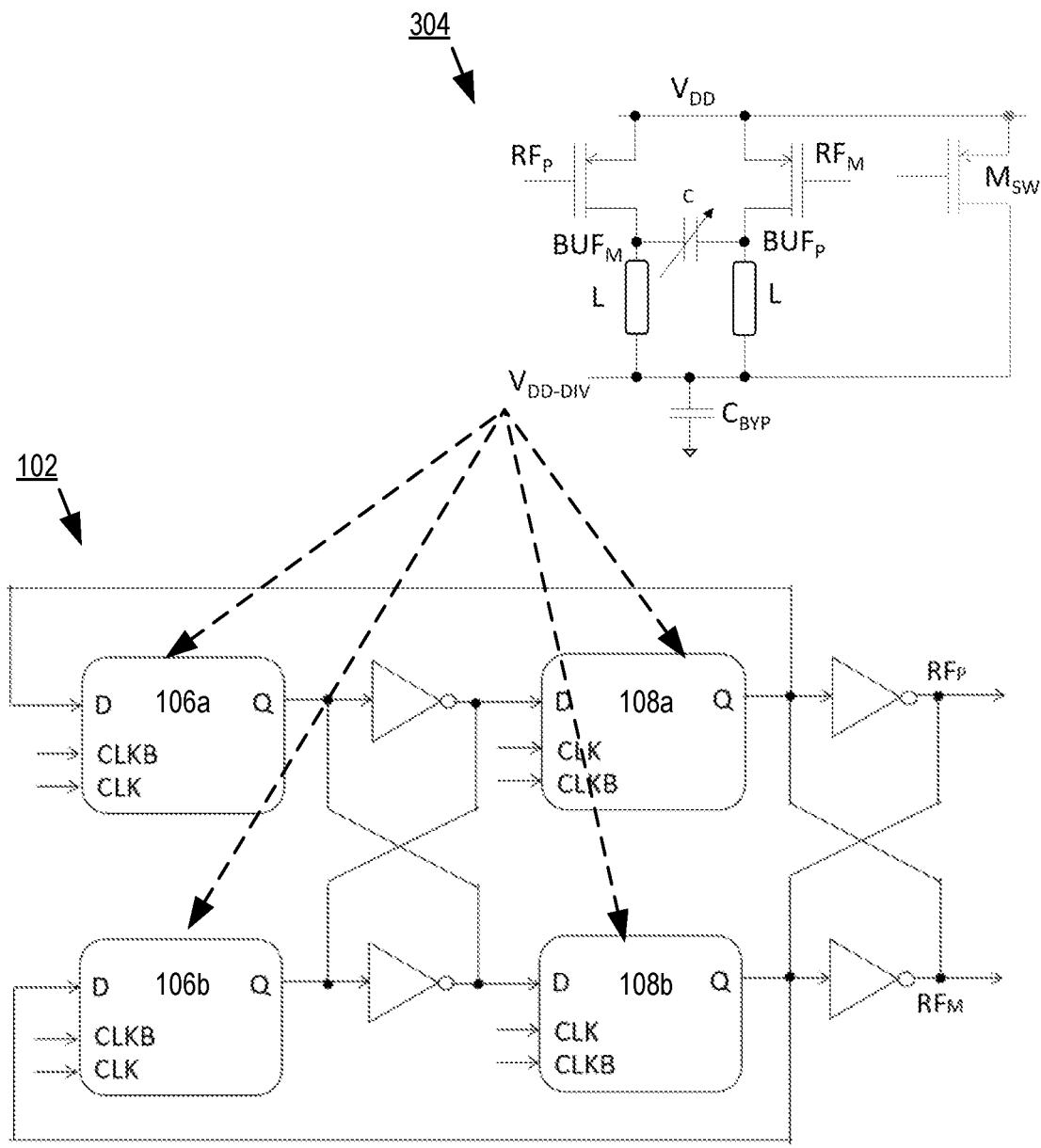
FIG. 3 is a circuit diagram of an example clock driver circuit for low powered clock driving according to some embodiments of the present disclosure.

Turning now to FIG. 3, shown is a circuit diagram for another clock driver circuit for low powered clock driving according to embodiments of the present disclosure. The clock driver circuit of FIG. 3 is similar to the clock driver circuit of FIG. 1 in that the clock driver circuit of FIG. 3 includes a multiple phase divider 102. Though the clock driver circuit of FIG. 3 includes a buffer 304, the buffer 304 differs from the buffer 104 of FIG. 1 in that the buffer 304 includes a switch $M_{SW}$ (e.g., a shunt switch). The switch allows for the buffer 304 to be deactivated without impacting operation of the multiple phase divider 102. The switch size may be large without impacting the buffer 304 performance in the ON state. In some embodiments, the switch may be used as part of a regulator loop. Here, the switch is located between the main voltage $V_{DD}$ and the intermediate voltage $V_{DD\text{-}DIV}$.

Figure 4:
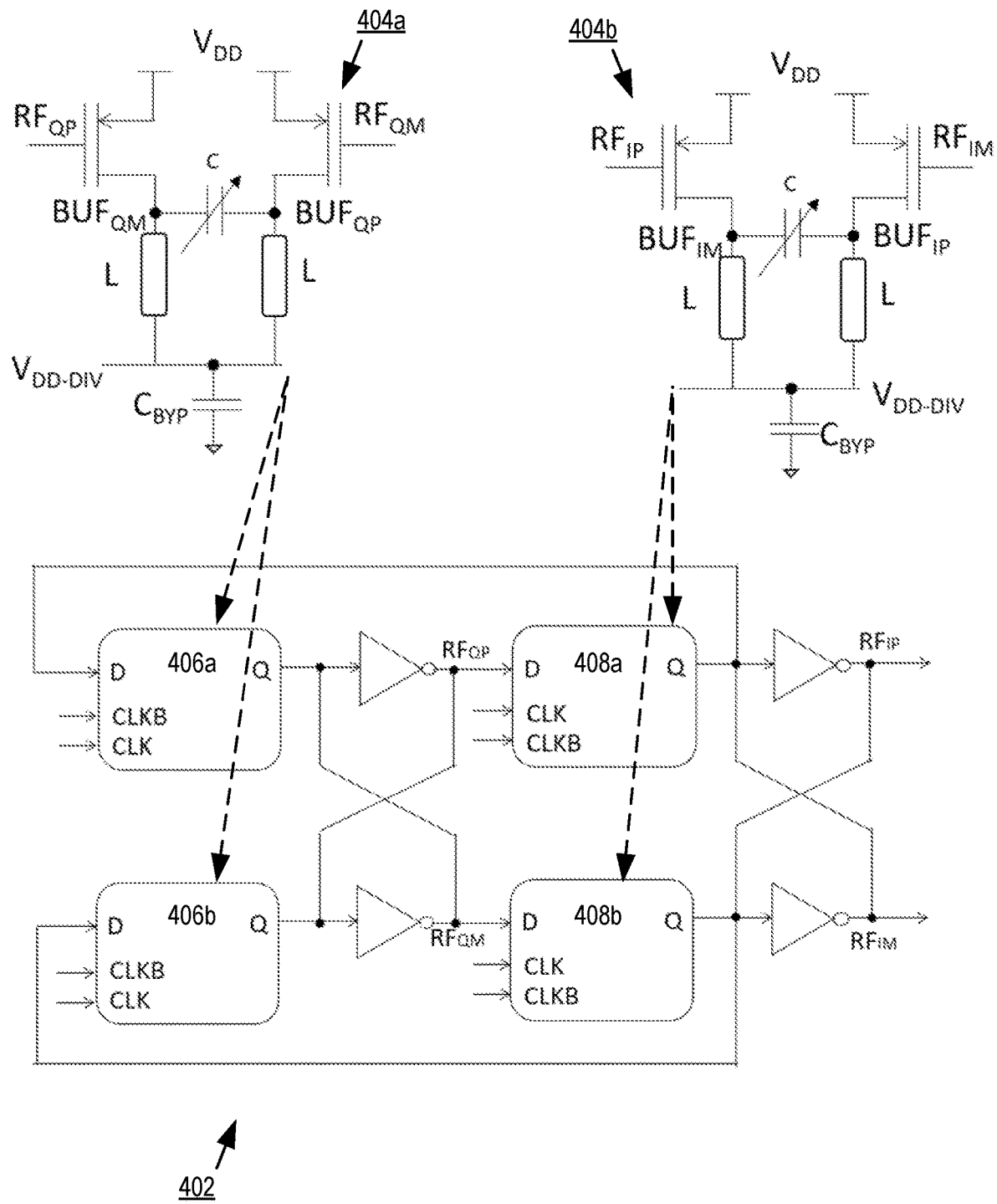
FIG. 4 is a circuit diagram of an example clock driver circuit for low powered clock driving according to some embodiments of the present disclosure.

Turning now to FIG. 4, shown is a circuit diagram for another clock driver circuit for low powered clock driving according to embodiments of the present disclosure. The clock driver circuit of FIG. 4 differs from the clock driver circuit of FIG. 1 in that the clock driver circuit of FIG. 4 is configured to separately and simultaneously drive the quadrature and in-phase portions of the input clock signal. The clock driver circuit of FIG. 4 includes a multiple phase divider 402 including DDFFs 406a,b and 408a,b. As shown in FIG. 4, the inputs to DDFFs 408a,b are provided as inputs to a first buffer 404a for driving the quadrature. Such inputs are shown as RF Quadrature plus ($RF_{QP}$) (e.g., the ninety degree phase) and RF Quadrature minus ($RF_{QM}$) (the two-hundred and seventy degree phase). The intermediate voltage $V_{DD\text{-}DIV}$ from the buffer 404a is provided to the DDFFs 406a,b. The quadrature plus and minus outputs of the buffer 404a are shown as $BUF_{QP}$ and $BUF_{QM}$, respectively. As the multiple phase divider 402 current is shared between two phases, each phase uses equal current and provides equal amplitude.

The outputs of the multiple phase divider 402, shown as RF in-phase plus ($RF_{IP}$) (e.g., the zero degree phase) and RF in-phase minus ($RF_{IM}$) (e.g., the one hundred and eighty degree phase) are provided as inputs to a second buffer 404b for driving in-phase. The intermediate voltage from the buffer 404b $V_{DD\text{-}DIV}$ is provided to the DDFFs 408a,b. The in-phase plus and minus outputs of the buffer 404b are shown as $BUF_{IP}$ and $BUF_{IM}$, respectively.

Figure 5:
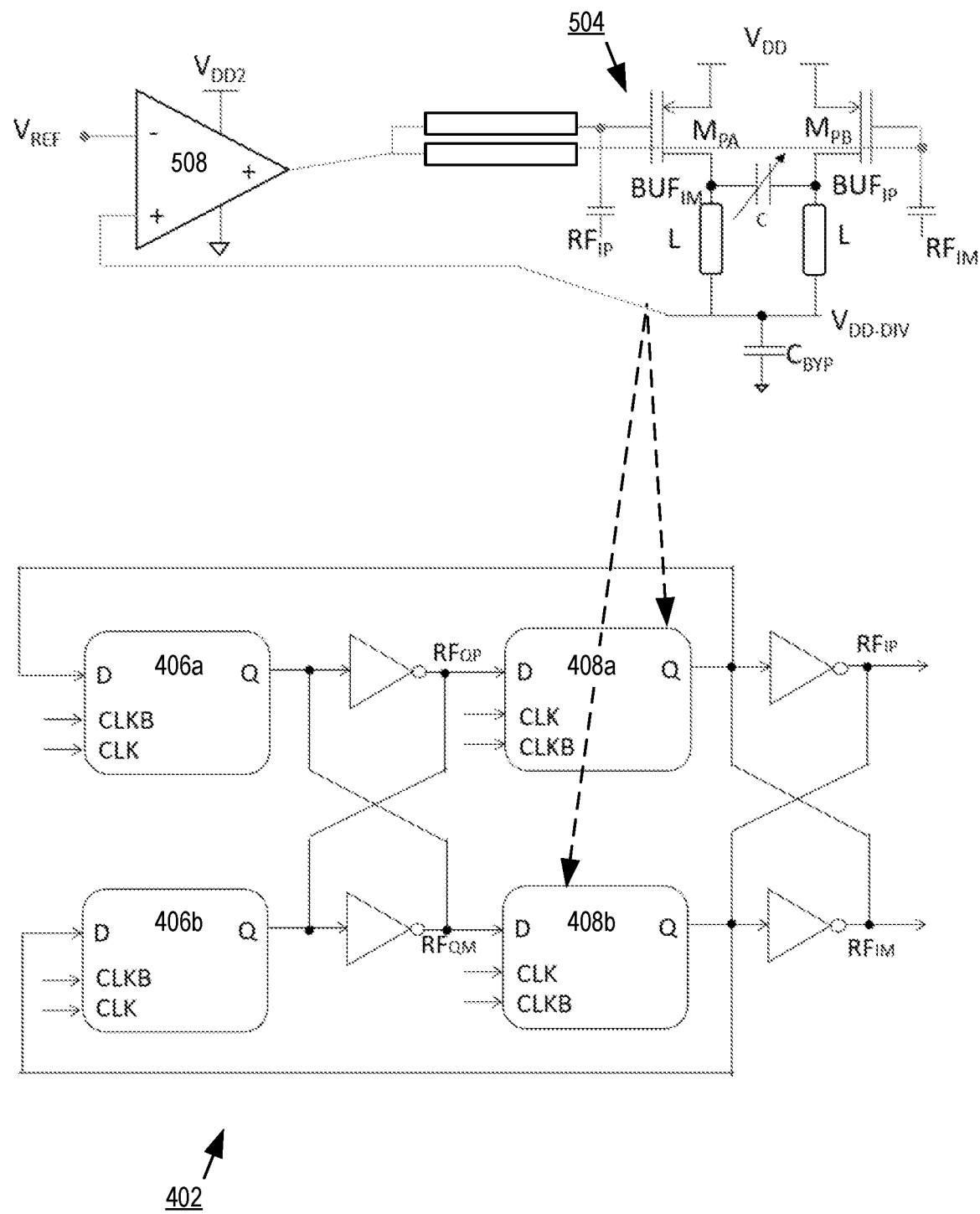
FIG. 5 is a circuit diagram of an example clock driver circuit for low powered clock driving according to some embodiments of the present disclosure.

Turning now to FIG. 5 shown is a circuit diagram for another clock driver circuit for low powered clock driving according to embodiments of the present disclosure. The clock driver circuit of FIG. 5 is similar to the clock driver circuit of FIG. 4 in that the clock driver circuit of FIG. 5 is configured to separately and simultaneously drive the quadrature and in-phase portions of the input clock signal. Accordingly, the clock driver circuit of FIG. 5 includes a multiple phase divider 402 including DDFFs 406a,b and 408a,b. A buffer providing voltage to the DDFFs 406a,b and receiving inputs $RF_{QP}$ and $RF_{QM}$ (e.g., similar to the buffer 404a of FIG. 4) is omitted for clarity.

The buffer 504 is similar to the buffer 404b of FIG. 4 but differs in that the inputs to buffer 504 (e.g., inputs $RF_{QP}$ and $RF_{QM}$) are coupled to an operational amplifier (OPAMP) 508. The OPAMP 508 is a high-gain voltage amplifier with a differential input and a single-ended output. Here, OPAMP 508 accepts as its differential input a reference voltage $V_{REF}$ and $V_{DD\text{-}DIV}$ from the buffer 504. The OPAMP 508 is powered by voltage $V_{DD2}$. Moderate loop gain between the OPAMP and the buffer 504 is accommodated by adjusting $V_{REF}$. One skilled in the art will appreciate that, though not shown, in some embodiments, a corresponding buffer receiving inputs $RF_{QP}$ and $RF_{QM}$ may also have an OPAMP coupled to the input lines.

Figure 6:
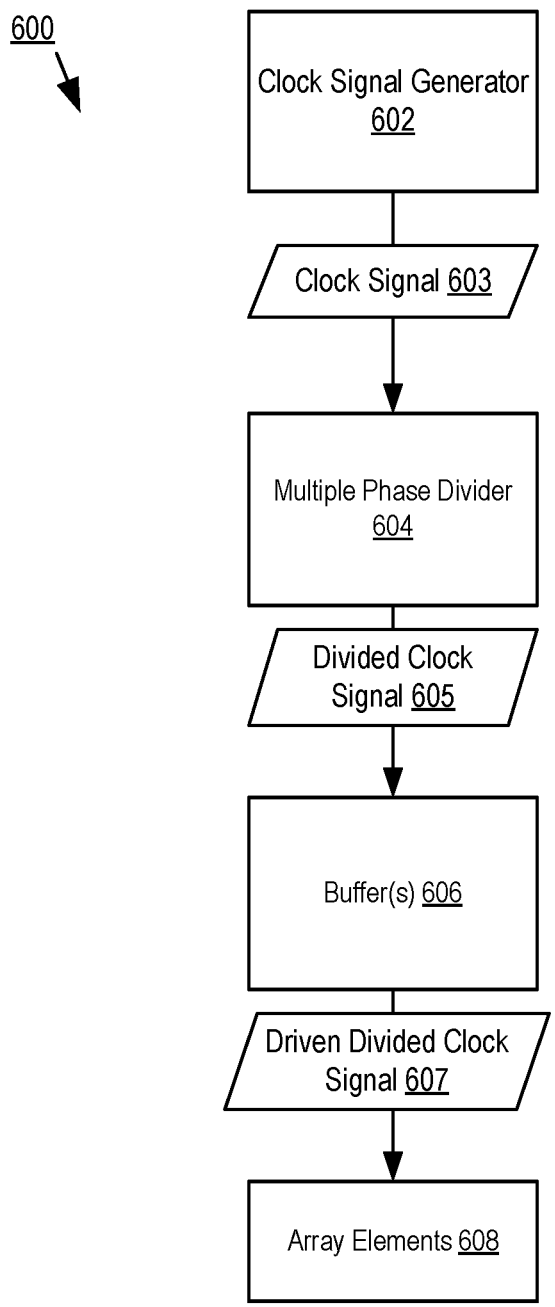
FIG. 6 is a block diagram of a low power array system for low powered clock driving according to some embodiments of the present disclosure.

FIG. 6 shows an example low power array system 600 including a clock driver circuit for low powered clock driving according to some embodiments of the present disclosure. The example low power array system 600 of FIG. 6 includes a clock signal generator 602. The clock signal generator 602 is configured to generate an electrical signal at a desired frequency. For example, the clock signal generator 602 includes a crystal oscillator circuit that generates an electrical signal using the mechanical resonance of a crystal. The resulting electrical signal generated by the clock signal generator 602 is a clock signal 603. In some embodiments, the clock signal 603 is embodied as a two-phase clock signal including two complementary clock signals with non-overlapping pulses (e.g., "CLK" and "CLKB" of FIGS. 1-5).

The example low power array system 600 of FIG. 6 also includes a multiple phase divider 604. The multiple phase divider 604 may be any of the multiple phase dividers as shown in FIGS. 1, 3-5 (e.g., multiple phase dividers 102, 402). The multiple phase divider 604 receives, as input, the clock signal 603 and provides, as output, a divided clock signal 605. The divided clock signal 605 is a clock signal of a frequency f/N, where f is the frequency of the clock signal 603 and N is an integer value corresponding to a number of delay cells in the multiple phase divider 604. For example, for a multiple phase divider 604 of N delay cells, the multiple phase divider 604 provides divide-by-N frequency division and 2N phases. The multiple phase divider 604 provides the divided clock signal 605 to one or more buffers 606.

The buffers 606 include any of the buffers as shown in FIGS. 1, 3-5 (e.g., buffers 104, 304, 404a,b, 504). For example, in some embodiments, the buffers 606 include a single buffer configured to drive, as output, plus and minus shifted output signals (e.g., "BUF$_P$" and BUF$_M$"). In other embodiments, the buffers 606 include multiple buffers configured to drive plus and minus in-phase and quadrature outputs (e.g., "BUF$_{IP}$," "BUF$_{IM}$," "BUF$_{QP}$," and "BUF$_{QM}$"). In some embodiments, the multiple phase divider 604 and the buffer(s) 606 share a same current from a same supply rail. For example, the multiple phase divider 604 and the buffer(s) 606 are coupled in parallel. In some embodiments, two or more of the clock signal generators 602, the multiple phase divider 604, and the buffer(s) 606 are stacked.

The output of the buffer(s) 606 is shown as a driven divided clock signal 607 that is provided to a plurality of array elements 608. The array elements 608 may include any of a variety of components that rely on a shared clock, including quantum computing channels, wireless transceivers (e.g., 5G transceivers), memory modules, and the like. By virtue of the multiple phase divider 604 and buffer(s) 606 sharing the same current, the array elements 608 are able to receive a clock signal with less jitter and reduced power consumption when compared to existing solutions.

Figure 7:
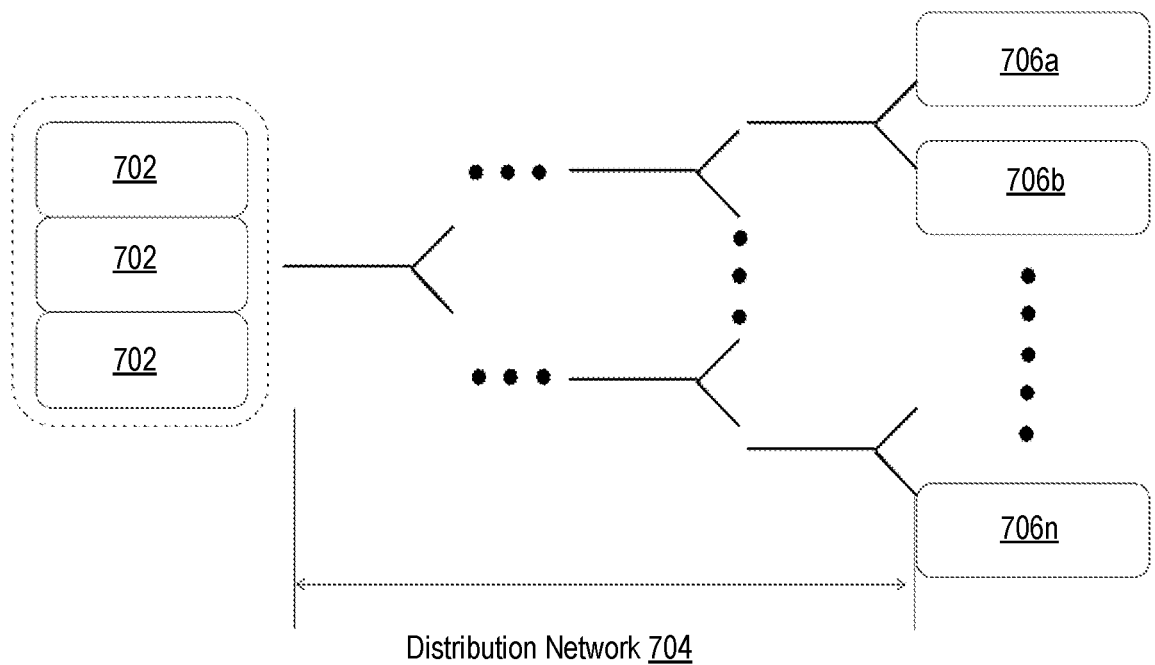
FIG. 7 is a diagram of an example system according to some embodiments of the present disclosure.

One skilled in the art will appreciate that the approaches set forth herein are not limited to a clock driver circuit, and are also applicable to other circuits where multiple stacked processing blocks are stacked such that at least one intermediate state is broadband. For example, as shown in FIG. 7, a plurality of signal processing blocks 702 may be stacked. The signal processing blocks 702 may be single ended or differential. Each of the signal processing blocks 702 may be powered up or down independently. One or more of the signal processing blocks 702 may be narrow band. The signal processing blocks 702 may each share a same supply rail as described above. The output of such signal processing blocks 702 may be provided by a distribution network 704 to a plurality of array elements 706a,b,n. For example, in some embodiments, a first signal processing block 702 at the bottom of a stack is an oscillator (narrowband), a second signal processing block 702 is a divider (broadband) and a third signal processing block 702 is a buffer (narrowband), such as in the clock driver circuits set forth above. As another example, a first signal processing block 702 is an amplifier, a second signal processing block 702 is a filter/delay network (wideband) and a third signal processing block 702 is an amplifier, driving N amplifiers in a beamformer as the array elements 706a-n. As another example, a first signal processing block 702 is a single-ended oscillator, a second signal processing block 702 is a single ended divider, and a signal processing block 702 stage is a differential buffer. One skilled in the art will also appreciate that a distribution network 704 may also be included in a stack with the signal processing blocks 702.

Figure 8:
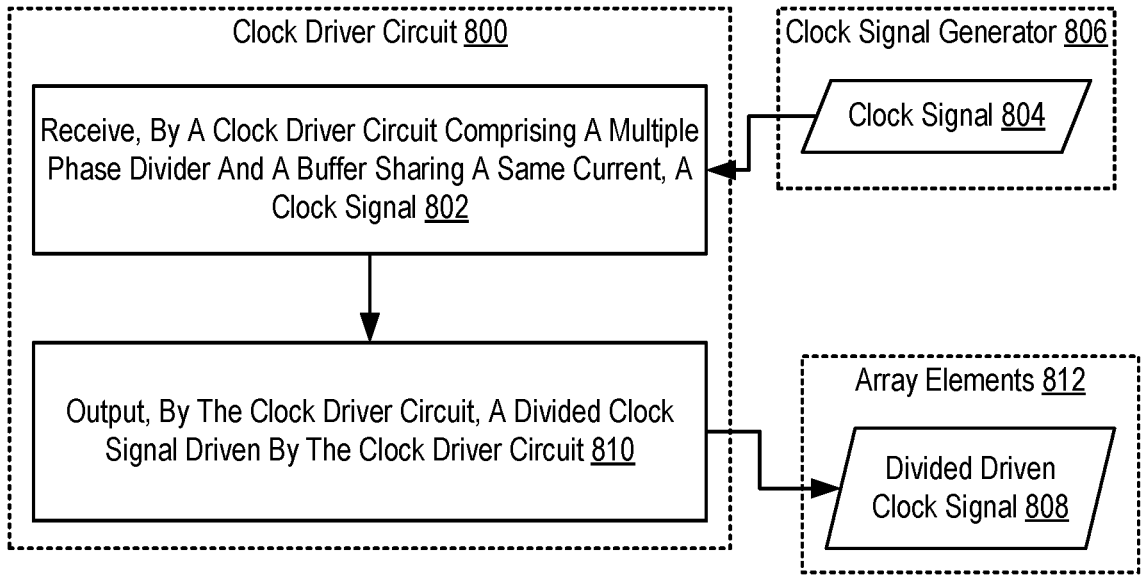
FIG. 8 is a flow chart of an example method for low powered clock driving according to some embodiments of the present disclosure.

For further explanation, FIG. 8 sets forth a flow chart illustrating an exemplary method for low powered clock driving according to embodiments of the present invention that includes receiving 802, by a clock driver circuit 800 comprising a multiple phase divider and a buffer sharing a same current, a clock signal 804. The clock signal 806 is received from a clock signal generator 806 configured to generate an electric signal at a desired frequency. For example, in some embodiments the clock signal generator 806 includes an oscillator circuit that generates the clock signal 804 based on the mechanical resonance of a crystal. In some embodiments, the clock signal 804 is embodied as a pair of complementary clock signals (e.g., a "two-phase clock signal"). The complementary clock signals are two signals of non-overlapping pulses that, in combination, pulse at the desired frequency.

The clock driver circuit 800 is configured to receive an input clock signal 804 and provide, as output, a divide driven clock signal 808 suitable for receiving components to be described in further detail below. The clock driver circuit 800 includes a multiple phase divider. The multiple phase divider receives the input clock signal 804 and provides, as output, another clock signal at a frequency f/N, where f is the frequency of the clock signal and N is an integer. For example, in some embodiments, the multiple phase divider outputs complementary clock signals RF$_P$ and RF$_M$ that are shifted one hundred and eighty degrees relative to each other. In other embodiments, the multiple phase divider outputs clock signal pairs RF$_{QP}$/RF$_{QM}$ and RF$_{IP}$/RF$_{IM}$, with RF$_{QP}$/RF$_{QM}$ corresponding to the quadrature and RF$_{IP}$/RF$_{IM}$ corresponding to in-phase.

In some embodiments, the multiple phase divider includes a plurality of DDFFs driven by an intermediate voltage V$_{DD\text{-}DIV}$ provided by the buffer, which itself is driven by a main voltage V$_{DD}$. The outputs of the multiple phase divider is provided to the buffer. For example, in some embodiments, outputs RF$_P$ and RF$_M$ are provided to a single buffer. In other embodiments, output pairs RF$_{QP}$/RF$_{QM}$ and RF$_{IP}$/RF$_{IM}$, with RF$_{QP}$/RF$_{QM}$ are each provided to respective buffers, with a first buffer driving in-phase signals from the multiple phase divider and the second buffer driving the quadrature signals from the multiple phase divider.

The buffer provides an impedance transformation to provide the desired signal amplitude to the load and prevent the inputs to the buffer from the multiple phase divider from being affected by the kickback noise from the outputs. The buffer and, as set forth above, provides the V$_{DD\text{-}DIV}$ to the multiple phase divider as set forth above, the multiple phase divider and the buffer share a same current. That is, the multiple phase divider and the buffer are provided current from a same supply rail. In some embodiments, the multiple phase divider and the buffer are coupled in parallel to the same supply rail. In some embodiments, the multiple phase divider and the buffer are stacked. In some embodiments, the clock signal generator is stacked with the multiple phase divider, the buffer, or both. Accordingly, in some embodiments, the clock signal generator also shares the same current as the multiple phase divider and the buffer. The sharing of current between the multiple phase divider, buffer, and/or the clock signal generator reduces overall power consumption.

In some embodiments, the multiple phase divider 102 and the buffer 104 are stacked (e.g., the buffer 104 is stacked on the multiple phase divider 102). In some embodiments, a clock signal generator such as an oscillator may be stacked with the multiple phase divider 102, the buffer 104, or both. In some embodiments, the multiple phase divider 102 and the buffer 104 share a common current. That is, both the multiple phase divider 102 and the buffer 104 share a current from a same supply rail (e.g., are connected in parallel). This reduces the overall power consumption of the clock driver circuit.

In some embodiments, the buffer is inductively loaded to the desired harmonic of the multiple phase divider. For example, in some embodiments, the buffer is inductively loaded to a fundamental harmonic of the outputs of the multiple phase divider (e.g., for a frequency f input to the frequency divider, the buffer is inductively loaded to f/2). In other embodiments, the buffer is inductively loaded to an odd harmonic of the multiple phase divider (e.g., for a frequency f, the buffer is inductively loaded to 3f/2).

In some embodiments, the buffer includes a switch (e.g., a shunt switch). The switch allows for the buffer to be deactivated without impacting operation of the multiple phase divider. The switch size may be large without impacting the buffer performance in the ON state. In some embodiments, the switch may be used as part of a regulator loop. In some embodiments, the switch is located between the main voltage $V_{DD}$ and the intermediate voltage $V_{DD\text{-}DIV}$ provided to the DDFFs of the multiple phase divider. In embodiments including multiple buffers (e.g., a buffer driving in-phase and another buffer driving the quadrature), each buffer may include a respective switch such that either phase may be driven independently, in combination, or not at all.

In some embodiments, the buffer is coupled to an operational amplifier (OPAMP). For example, the OPAMP may be coupled to the input lines from the multiple phase divider. In embodiments including multiple buffers (e.g., a buffer driving in-phase and another buffer driving the quadrature), each buffer may be coupled to a corresponding OPAMP. The OPAMP is a high-gain voltage amplifier with a differential input and a single-ended output. For example, an OPAMP may accept as its differential input a reference voltage $V_{REF}$ and $V_{DD\text{-}DIV}$ from the buffer to which it is coupled. The OPAMP is powered by voltage $V_{DD2}$. Moderate loop gain between the OPAMP and the coupled buffer is accommodated by adjusting $V_{REF}$.

The method of FIG. 8 also includes outputting 810, by the clock driver circuit 800, a divide clock signal driven by the clock driver circuit 800 (e.g., a divided driven clock signal 808). The divided driven clock signal 808 is the output of the buffer(s) of the clock driver circuit 800. In some embodiments, the divided driven clock signal 808 is output to a plurality of array elements 812. The array elements 812 are an array of components that operate using a same synchronized clock. For example, the array elements 812 may not be suitable for operating based on the clock signal 804 directly from the clock signal generator 806, and instead must function based on a divided driven clock signal 808 output by the clock driver circuit 800. For example, the array elements 812 may include an array of synchronized transceivers (e.g., in a 5G array), an array of memory modules, an array of quantum computing channels, and the like.

In view of the explanations set forth above, readers will recognize that the benefits of low powered clock driving according to embodiments of the present invention include:

Improved performance of a computing system through the use of a low power clock that provides reduced jitter and power consumption.

Improved performance of a computing system by having switches on buffers of a clock driver circuit, allowing for independent operation of buffers without affecting multiple phase divider performance.

Flexible selection of the number of clock phases used for distribution to the computing system array.

Exemplary embodiments of the present invention are described largely in the context of a fully functional computer system for low powered clock driving. Readers of skill in the art will recognize, however, that the present invention also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the invention as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present invention.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A system comprising:
   a plurality of signal processing blocks, wherein each of the plurality of signal processing blocks are stacked and share a same current, wherein one or more intermediate signal processing blocks of the plurality of signal processing blocks comprises a broadband signal processing block;
   a distribution network receiving, as input, an output of the plurality of signal processing blocks; and
   a plurality of array elements each receiving an input from the distribution network.

2. The system of claim 1, wherein the plurality of signal processing blocks comprises an oscillator, a multiple phase divider, and a buffer.

3. The system of claim 1, wherein the plurality of signal processing blocks comprises a first amplifier, a delay network, and a second amplifier, and wherein the plurality of array elements comprise a plurality of third amplifiers in a beamformer.

4. The system of claim 1, wherein the plurality of signal processing blocks comprises a single ended oscillator, a single ended divider, and a differential buffer.

5. The system of claim 1, wherein the distribution network is stacked with the plurality of signal processing blocks.

6. The system of claim 1, wherein the plurality of array elements includes one of an array of antennas, an array of memory modules, an array of sensors, and an array of quantum computing channels.

7. The system of claim 1, wherein the output of the plurality of signal processing blocks is a divided clock signal.

8. An apparatus comprising:
   a plurality of signal processing blocks, wherein each of the plurality of signal processing blocks are stacked and share a same current, wherein one or more intermediate signal processing blocks of the plurality of signal processing blocks comprises a broadband signal processing block; and
   a distribution network receiving, as input, an output of the plurality of signal processing blocks.

9. The apparatus of claim 8, wherein the plurality of signal processing blocks comprises an oscillator, a multiple phase divider, and a buffer.

10. The apparatus of claim 8, wherein the plurality of signal processing blocks comprises a first amplifier, a delay network, and a second amplifier.

11. The apparatus of claim 8, wherein the plurality of signal processing blocks comprises a single ended oscillator, a single ended divider, and a differential buffer.

12. The apparatus of claim 8, wherein the output is a divided clock signal.

13. The apparatus of claim 8, wherein a distribution network is stacked with the plurality of signal processing blocks.

14. A method comprising:
generating, by a circuit comprising a plurality of signal processing blocks, an output signal, wherein each of the plurality of signal processing blocks are stacked and share a same current, wherein one or more intermediate signal processing blocks of the plurality of signal processing blocks comprises a broadband signal processing block; and
providing, by the circuit, the output signal to a distribution network.

15. The method of claim 14, wherein the plurality of signal processing blocks comprises an oscillator, a multiple phase divider, and a buffer.

16. The method of claim 14, wherein the plurality of signal processing blocks comprises a first amplifier, a delay network, and a second amplifier.

17. The method of claim 14, wherein the plurality of signal processing blocks comprises a single ended oscillator, a single ended divider, and a differential buffer.

18. The method of claim 14, wherein a distribution network stacked with the plurality of signal processing blocks.

19. The method of claim 14 further comprising:
receiving, by a plurality of array elements, an input from the distribution network.

20. The method of claim 19, wherein the plurality of array elements includes one of an array of antennas, an array of memory modules, an array of sensors, and an array of quantum computing channels.

* * * * *